United States Patent [19]

Memis et al.

[11] Patent Number: 4,971,894

[45] Date of Patent: Nov. 20, 1990

[54] METHOD AND STRUCTURE FOR PREVENTING WET ETCHANT PENETRATION AT THE INTERFACE BETWEEN A RESIST MASK AND AN UNDERLYING METAL LAYER

[75] Inventors: Irving Memis, Vestal; Frederick M. Rovente, Binghamton, both of N.Y.

[73] Assignee: International Business Machines Corporation, Armonk, N.Y.

[21] Appl. No.: 309,575

[22] Filed: Feb. 13, 1989

[51] Int. Cl.$^5$ ................................................ G03C 5/00
[52] U.S. Cl. .................................... 430/323; 430/318; 430/327; 430/935
[58] Field of Search ................ 430/318, 327, 935, 323

[56] References Cited

U.S. PATENT DOCUMENTS

| | | |
|---|---|---|
| 3,443,745 | 5/1969 | Walchle et al. |
| 3,629,036 | 12/1971 | Isaacson ................................. 156/241 |
| 3,854,973 | 12/1974 | Mersereau et al. ..................... 117/47 |
| 3,969,177 | 7/1976 | Doran et al. ............................ 156/288 |
| 4,069,076 | 1/1978 | Fickes ..................................... 156/83 |
| 4,075,051 | 2/1978 | Brzozowski ............................ 156/236 |
| 4,285,781 | 8/1981 | Le Rouzic et al. ..................... 204/15 |
| 4,378,264 | 3/1983 | Pilette et al. ........................... 156/238 |
| 4,615,763 | 10/1986 | Gelome et al. ........................ 156/643 |

FOREIGN PATENT DOCUMENTS 0040843 12/1981 European Pat. Off. ............ 430/935

*Primary Examiner*—Jose Dees
*Attorney, Agent, or Firm*—Calfee, Halter & Griswold

[57] ABSTRACT

A method and structure which will prevent wet etchant penetration at the interface region of a masked metal layer during etching of an exposed portion of the metal adjacent thereto is provided. The metal is provided with a matte finish of 0.1 and 0.5 mils peak to valley. The metal is covered with a dry film photoresist material which has been plasticized to have a surface deflection of at least 0.5 mils without losing its plasticity and conforms to the surface pattern of the metal. The photoresist is imagewise patterned and developed, and the exposed or revealed regions of the metal are subject to a wet etching process. The conformed coating of the resist prevents wet etchant penetration.

5 Claims, No Drawings

METHOD AND STRUCTURE FOR PREVENTING WET ETCHANT PENETRATION AT THE INTERFACE BETWEEN A RESIST MASK AND AN UNDERLYING METAL LAYER

BACKGROUND OF THE INVENTION

This invention relates generally to a method and structure for preventing of unwanted wet etchant penetration at the interface region between photoresist material and underlying masked metal area when an adjacent area of unmasked exposed metal is being etched.

In the processing of circuit boards according to one conventional technique, a copper plate or layer is provided on one or both sides of an underlying substrate. The copper is patterned by photoresist and etch techniques to form the desired line and pad patterns prior to subsequent fabrication of the completed printed circuit board. One conventional technique for providing the desired line and pad pattern on the copper layer is by photolithographic technology. In this technology a photoresist material is applied over the exposed copper layer and then patternwise exposed to actinic radiation and developed to delineate the desired pattern in the photoresist. The photoresist can be either negative or positive resist as is well known in the art. Following the exposure and development, the desired pattern is transferred to the underlying copper below the developed and dissolved photoresist. The copper remaining underneath the undissolved and hence remaining photoresist defines the ultimately desired pattern of wires and pads. Following the developing of the photoresist, the revealed underlying copper is etched to remove it thereby leaving the masked copper adhering to the substrate. This is conventional prior art technology.

In forming the copper layer or plates on a substrate, one conventional prior art practice is to use planishing plates which are highly polished and extremely smooth as interface plates when the substrates with the copper layers are being formed. Such a technique is described in the prior art section of U.S. Pat. No. 3,969,177. This patent describes the prior art technique of utilizing planishing plates in the process of fabricating the printed circuit panels. As described in this patent, it is necessary to have a relatively flat surface to provide for proper adherence of the thin film photoresist. Further, as described in this patent, the use of planishing plates has several drawbacks including dimensional instability of the laminated panels. Also, when planishing plates are used and reused the plates tend to get nicked and scarred which will result in the plates leaving an impression on the surface of the copper; and, additionally when they are used and reused even under reasonably clean conditions specks of material can be found to be adhering to the surface of the planishing plates which will also cause surface irregularities in the copper plate and leave traces of epoxy on the surface.

U.S. Pat. No. 3,969,177 describes a technique wherein partially cured cores with copper plates thereon are used in place of planishing plates, and circuit boards are formed using copper to copper plate contact in place of a planishing plate against the copper. As described therein, a reasonably smooth surface is provided by this manner. However, even this surface which while reasonably smooth still is a matte finish and has a peak to valley roughness of up to 0.2 mils. This degree of surface roughness or degree of matte finish is acceptable in many application wherein photoresist technology is utilized. However, as advancing technology allows smaller and smaller lines to be formed and narrower spacing between lines to be accomplished, even this surface roughness in many instances, is significant enough that when using certain conventional dry photoresist techniques the wet etchant penetration is significant enough to provide an unacceptably high number of shorts and opens in the location adjacent to those areas where the copper has been etched.

While smoother copper surfaces could be provided by the use of planishing plates, i.e. a smoother overall surface would be provided, nevertheless, the planishing plates still have the significant drawbacks as noted above.

SUMMARY OF THE INVENTION

According to the present invention, a method and structure for essentially preventing wet etchant penetration of a masked metal layer during etching of an adjacent exposed portion of the metal layer is provided. A metal is provided on a substrate material with the metal layer having a matte finish with a surface roughness of between 0.1 to 0.5 mils peak to valley. A film of self-supporting photoresist material is applied on to the metal layer and the film is plasticized so that it has a surface deflection of at least 0.5 mils without losing its plasticity thereby causing the surface of the film contacting the matte surface of the metal to conform to the surface configuration of the metal. Thereafter, the photoresist is patterned and developed to reveal portions of the underlying metal adjacent portions of the masked material. Finally, the revealed metal is etched and the overlying conforming coating of the undeveloped photoresist prevents wet etchants penetration at the interface surface regions of the film of the resist and the underlying metal.

DESCRIPTION OF THE PREFERRED EMBODIMENT

The present invention is directed toward a method and structure which will prevent wet etchant penetration of the interface layer between a photoresist material and the copper or other metal layer on a circuit board during the photolithographic and etching steps of preparing a printed circuit board.

As described above, it is possible to obtain generally very smooth surfaces on the copper layer of panels used to form circuit boards if a smooth planishing plate is utilized. However, the use of the planishing plate as described in U.S. Pat. No. 3,969,177, has several serious limitations including dimensionally unstable products and also the potential for serious macro surface deficiencies. These macro surface deficiencies normally result from surface defects on the planishing plate as the plate is used over and over again and also they result from the adherence of foreign matter such as particles from prepreg which is used to form the panels. The planishing plates are normally exposed to these particles as they are used over and over again in the process of forming the patents.

U.S. Pat. No. 3,969,177 discloses a process of forming such panels wherein planishing plates are not used in the final cure but actually two copper plates are utilized abutting each other in the final cure which configuration will provide a surface on the copper having matte-type finish. This matte finish has a surface roughness of between 0.1 and 0.2 mils peak to valley. Hence, the overall roughness of the sheet is somewhat rougher than the overall roughness of the sheet formed by the planishing plates but the surface is essentially uniform is dimensionally stable and does not have the propensity for macro defects resulting from damaged plates, nor are there particles of prepreg adhering to the plates since the entire stack can be assembled prior to the curing operation. In any event, by whatever method obtained the starting material for the present invention is a substrate having a copper layer or sheet disposited on at least one and in some cases both sides thereof which copper sheet has a relatively uniform matte finish surface with a roughness of between 0.1 and 0.2 mils peak to valley. The preferred method of producing this type of surface is according to the teachings of said U.S. Pat. No. 3,969,177.

In the past, where the line width and line spacing has been substantial, this type of matte finish has proved very satisfactory irrespective of the type of photoresist applied thereover which is subsequently patterned and developed to expose the underlying metal and the metal thereafter removed by wet etching processes. However, as the technology has advanced the line widths and spacings have decreased with 4 mil line widths and spaces being common, and extending down to 2 mil line widths and spaces. It has been found that with many conventional thin film self-supporting resist materials there is a significant amount of wet etchant penetration at the resist-metal interface to a sufficient extent that electrical discontinuities in the forms of shorts and opens are formed. It is not completely understood why this happens but it is believed that it is related to the phenomenon of the matte finish providing peaks on which relatively rigid solid photoresist resides and that when the photoresist has been removed in the patterned area and the underlying exposed copper etched, the valleys underlying the photoresist material and beneath the peaks form a channel for the enchant to penetrate underneath the photoresist mask and actually attack the copper even beneath the masked areas adjacent where etching is taking place. This phenomenon has been observed when attempting to utilize various types of photoresist "dry films" such as DuPont films sold under the trade names 3515, LD2, T168, and film AE sold by Dynachem Corp.

This phenomena could be averted by utilizing liquid resist which would fill in the peaks and valleys. However, there are many drawbacks to liquid photoresist technology and in many instances dry film technology is preferred.

It has been found that by selecting and carefully controlling certain parameters of the self-support film, a "dry film" photoresist technology can be applied and still avert the wet etchant penetration phenomena. To this end a film of photoresist material which is a self-supporting dry film structure is applied over the copper layer. It is critical that the photoresist material be plasticized so as to have a surface deflection of at least 0.5 mils without loosing its plasticity. It is essential that the thin film photoresist material be applied such that the surface of the photoresist material contacting the underlying material, due to its plasticity, conforms to the surface pattern of the metal surface. The sheet of photoresist material should be from about 1.0 to 2.0 mils thick. Following this, the photoresist is imagewise patterned, exposed, and developed in a conventional manner so as to reveal areas of unmasked copper adjacent areas of copper which are masked by the cured photoresist material which has not been developed away. A typical process for applying the photoresist is as follows: The surface of the panel is prepared by chemical and/or mechanical techniques, a preferred technique being a dilute cupric chloride etch and a scrub with a pumice slurry. The sheet of resist material is applied by a hot roll laminator, with temperatures being typically from 75°C. to 100°C., and pressures typically from 75 PSIG to 100 PSIG. The exposure is done through a photoresist mask using a light source and dosage based on the requirements of the particular photoresist as is well known in the art. The thus patterned photoresist is developed, removing the exposed or unexposed area depending upon whether a positive or negative resist is utilized. Typically an aqueous solution of sodium carbonate can be used.

At this point in the process the revealed copper is etched in a conventional manner. The conformal nature of the photoresist coating conforming to the matte finish of the copper layer prevents any significant penetration of the etching material at the interface between the copper and the photoresist material. A preferred etching technique employs inline transportation of the panel beneath spray nozzles which spray an etching material of a cupric chloride solution onto the panel.

The following two examples demonstrate the criticality of the conformal self-supporting character of the film of photoresist material.

Two identical panels having a substrate and a copper layer thereon formed as previously described according to the teachings of U.S. Pat. No. 3,969,177 where provided. One of the panels was coated with 3515 resist which is commercially available film of photoresist material available from E.I. DuPont Co. The other panel was coated with I-102 photoresist material also sold by E.I. DuPont Co. and plasticized so as to provide a surface deflection of at least 0.5 mils without losing its plasticity as will be described presently. The exact composition of the I-102 photoresist is not known; however, it is believed that it is essentially as described in E.I. DuPont, U.S. Pat. No. 4,378,264 which describes a dry sheet photoresist which can be laminated onto a substrate.

Each of the two laminations were applied according to conventional well-known techniques, these techniques varying slightly with the two different types of resist and with the addition of the plastization step for the I-102 material. The I-102 photoresist material was applied and exposed as follows: The surface was cleaned with cupric chloride and pumice technique as described above. Following this, a water solution of 0.02% maldene 26159 (which is an adhesion promoter sold by Borg Warner Corp.), was applied to the surface. The water is for the purpose of plasticizing the resist during the subsequent application step. The I-102 sheets were applied on an E.I. DuPont Co. Riston hot roll laminator running at a speed of 5 feet per minute at a temperature of about 107 °C. The panels were exposed at 250 millijoules per sq. cm on a PC printer manufactured by E.I. DuPont Co. The exposed film was developed in a conventional manner as described above in aqueous sodium carbonate.

The water on the surface of the panel acted as a plasticizer for the sheet of photoresist material to provide the required plasticity of a surface deflection of at least 0.5 mils.

The 3515 film was applied and exposed as follows: The surface was cleaned, as described above. However, no water was applied since this type of resist cannot be effectively plasticized with water. The sheet of resist was then applied with a conventional hot roll laminator running at a speed of 5.5 feet per minute at 80° C. Exposure was on a PC 30 printer at 100 millijoules per square centimeter. This film was then developed in a conventional manner as described above in aqueous sodium carbonate.

Each of the panels were cut into 39 different test pieces and tested for shorts and opens. The tests were performed on a conventional tester in which a series of probes on 100 mil centers are contacted onto the panel. A matrix of electrical signals is applied sequentially to each set of circuits and the number of shorts and opens is tabulated. A short is defined as a resistance between circuits of less than 1 megohm, and an open is defined as a circuit having a resistance in excess of 100 ohms. This is a conventional electrical test well known in the art. The results of these tests are shown in Table I below.

TABLE I

| E. I. DuPont 3515 Resist | | | | I-102 Resist | | | |
|---|---|---|---|---|---|---|---|
| Panel | Shorts | Opens | Total | Panel | Shorts | Opens | Total |
| 1 | 53 | 1 | 54 | 1 | 0 | 0 | 0 |
| 2 | 19 | 0 | 19 | 2 | 0 | 0 | 0 |
| 3 | 13 | 7 | 20 | 3 | 0 | 0 | 0 |
| 4 | 19 | 8 | 17 | 4 | 0 | 0 | 0 |
| 5 | 12 | 3 | 15 | 6 | 0 | 0 | 0 |
| 6 | 19 | 1 | 20 | 6 | 0 | 0 | 0 |
| 7 | 35 | 6 | 41 | 7 | 0 | 0 | 0 |
| 8 | 25 | 15 | 40 | 8 | 0 | 0 | 0 |
| 9 | 11 | 8 | 19 | 9 | 0 | 0 | 0 |
| 10 | 79 | 12 | 91 | 10 | 0 | 0 | 0 |
| 11 | 32 | 1 | 33 | 11 | 0 | 0 | 0 |
| 12 | 28 | 3 | 31 | 12 | 0 | 0 | 0 |
| 13 | 40 | 2 | 42 | 13 | 0 | 0 | 0 |
| 14 | 27 | 1 | 28 | 14 | 0 | 0 | 0 |
| 15 | 73 | 2 | 75 | 15 | 1 | 0 | 0 |
| 16 | 14 | 1 | 15 | 16 | 0 | 1 | 1 |
| 17 | 26 | 0 | 26 | 17 | 3 | 1 | 4 |
| 18 | 5 | 1 | 6 | 18 | 1 | 1 | 2 |
| 19 | 55 | 1 | 57 | 19 | 0 | 3 | 3 |
| 20 | 27 | 2 | 29 | 20 | 0 | 2 | 2 |
| 21 | 29 | 0 | 29 | 21 | 1 | 2 | 3 |
| 22 | 95 | 6 | 101 | 22 | 2 | 2 | 4 |
| 23 | 86 | 8 | 94 | 23 | 3 | 0 | 3 |
| 24 | 124 | 2 | 126 | 24 | 2 | 0 | 2 |
| 25 | 63 | 0 | 63 | 25 | 0 | 1 | 1 |
| 26 | 86 | 11 | 97 | 26 | 1 | 0 | 1 |
| 27 | 71 | 3 | 74 | 27 | 2 | 1 | 3 |
| 28 | 138 | 7 | 145 | 28 | 0 | 2 | 2 |
| 29 | 26 | 8 | 34 | 29 | 0 | 1 | 1 |
| 30 | 20 | 0 | 20 | 30 | 1 | 0 | 1 |
| 31 | 52 | 0 | 52 | 31 | 1 | 0 | 1 |
| 32 | 42 | 3 | 45 | 32 | 4 | 0 | 4 |
| 33 | 25 | 0 | 25 | 33 | 1 | 0 | 1 |
| 34 | 18 | 14 | 32 | 34 | 1 | 0 | 1 |
| 35 | 24 | 1 | 25 | 35 | 1 | 0 | 1 |
| 36 | 33 | 3 | 36 | 36 | 1 | 0 | 1 |
| 37 | 33 | 5 | 38 | 37 | 1 | 0 | 1 |
| 38 | 12 | 2 | 14 | 38 | 1 | 2 | 3 |
| 39 | Improperly exposed | | | 39 | 0 | 1 | 1 |

The results clearly show the 3515 photoresist material was entirely unsatisfactory whereas the I-102 photoresist material plasticized and applied according to this invention provided result with very little electrical incontinuities.

It is evident from an examination of the table that the matte finished panels having the relatively rigid 3515 photoresist material applied thereto had a very large and significant number of electrical deficiencies a minimum total being 14 and the maximum being 145 or more. On the other hand, the panels that had the I-102 photoresist material applied thereto had very few electrical deficiencies and, in many cases even having none at all, and never in any case more than 4. It is clear from the examination of the table that by the use of a matte finish copper panel in combination with a dry film photo etched material, which photo etched material has been closely controlled to have a surface deflection of at least 0.5 mils without losing its plasticity a greatly improved structure results. The conformal pattern with the underlying copper prevents the electrical shorts and opens and other similar types of deficiencies.

While one embodiment of this invention has been shown and described, various adaptation and no modifications can be made without departing from the scope thereof as defined by the appended claims.

We claim:

1. A method of essentially preventing wet etchant penetration at the interface of the material masking an underlying metal layer during etching of exposed portions of the metal layer adjacent to the masked portion comprising the steps of;

providing a first metal layer on a substrate, forming a matte finish of a surface roughness of 0.1 to 0.5 mils rms peak to valley on said first metal layer by heating a second metal layer under pressure in contact with said first metal layer;

providing a film of self-supporting photoresist material on said metal layer, plasticizing said film of photoresist material to have a surface deflection of at least 0.5 mils while still retaining its plasticity, concurrently therewith pressure applying said photoresist material to said metal layer, thereby causing the surface of the film contacting the surface of the metal to deflect to conform to the surface configuration of the metal, patterning and developing said photoresist to reveal portions of the underlying first metal layer adjacent portions of a said first metal layer masked by the undeveloped photoresist;

and wet etching the said revealed metal;

whereby the overlying conforming coating of the undeveloped photoresist will prevent wet etchant penetration at the interface surfaces of the photoresist and underlying material.

2. The invention as defined in claim 1 wherein said underlying metal is a copper layer.

3. The invention as defined in claim 1 wherein the thickness of the photoresist film is between 1.0 and 2.0 mil.

4. The invention as defined in claim 1 wherein the film of photoresist material is applied by hot roll laminating.

5. The invention as defined in claim 4 wherein the plasticizing of the film of photoresist material is performed by applying water to the metal layer prior to the hot roll laminating step.

* * * * *